United States Patent
Vleggaar et al.

[11] Patent Number: 6,160,346
[45] Date of Patent: *Dec. 12, 2000

[54] ORGANIC ELECTROLUMINESCENT DEVICE WITH HOUSING

[75] Inventors: Jeroen J. M. Vleggaar, Eindhoven, Netherlands; Yang Yang, Los Angeles, Calif.; Marcus G. Van Munster; Petrus J. M. Peters, both of Eindhoven, Netherlands

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/863,698

[22] Filed: May 27, 1997

[30] Foreign Application Priority Data

May 28, 1996 [EP] European Pat. Off. .............. 96201466

[51] Int. Cl.[7] .................................................. H05B 33/04
[52] U.S. Cl. ............................................ 313/512; 313/504
[58] Field of Search .................................. 313/512, 504, 313/503, 495, 506

[56] References Cited

U.S. PATENT DOCUMENTS

| | | | |
|---|---|---|---|
| 5,578,903 | 11/1996 | Pepi | 313/495 |
| 5,652,067 | 7/1997 | Ito et al. | 313/503 |
| 5,675,212 | 10/1997 | Schmid et al. | 313/495 |
| 5,731,661 | 3/1998 | So et al. | 313/504 |
| 5,771,562 | 6/1998 | Harvey, III et al. | 313/504 |
| 5,811,177 | 9/1998 | Shi et al. | 313/512 |
| 5,874,804 | 2/1999 | Rogers | 313/512 |

OTHER PUBLICATIONS

"Photo–and electroluminescence efficiency in poly(dialkoxy–p–phenylenevinylene)", by D. Braun et al in Synthetic Metal 66 1994, pp. 75–79. (No Month).

"Reliability and degradation of organic light emitting devices", by P.E. Burrows et al., Applied Physics Letter, vol. 65, No. 23, Dec. 5, 1994.

*Primary Examiner*—Michael H. Day
*Attorney, Agent, or Firm*—John Fox

[57] ABSTRACT

An organic electroluminescent device includes an electroluminescent element, which is enclosed in a housing. The deterioration in uniformity of the luminous surface, which occurs when an electroluminescent device is stored or operated under ambient conditions, and which deterioration manifests itself, for example, in the form of "dark spots", can be overcome to a substantial degree in accordance with the invention by using an airtight and waterproof housing which is sealed by a low-melting metal, such as a BiSn alloy.

7 Claims, 3 Drawing Sheets

ORGANIC ELECTROLUMINESCENT DEVICE WITH HOUSING

BACKGROUND OF THE INVENTION

The invention relates to an electroluminescent device having an electroluminescent element, which includes an electroluminescent organic layer, which contacts two electrodes, the electroluminescent element being enclosed in a housing.

An electroluminescent (EL) device is a device which, while making use of the phenomenon of electroluminescence, emits light when the device is suitably connected to a power supply. If the light emission originates in an organic material, the device is referred to as an organic electroluminescent device. An organic EL device can be used, inter alia, as a thin light source having a large luminous surface area, such as a backlight for a liquid crystal display or a watch. An organic EL device can also be used as a display if the EL device comprises a number of EL elements, which may or may not be independently addressable.

The use of organic layers as an EL layer in an EL element is known. Known organic layers generally include a conjugated, luminescent compound. This compound may be a low-molecular dye, such as a coumarin, or a high-molecular compound, such as a poly(phenylenevinylene). The EL element also includes two electrodes, which are in contact with the organic layer. By applying a suitable voltage, the negative electrode, i.e. the cathode, will inject electrons and the positive electrode, i.e. the anode, will inject holes. If the EL element is in the form of a stack of layers, at least one of the electrodes should be transparent to the light to be emitted. A known transparent electrode material for the anode is, for example, indium tin oxide (ITO). Known cathode materials are, inter alia, Al, Yb, Mg:Ag, Li:Al or Ca. Known anode materials are, in addition to ITO, for example, gold and platinum. If necessary, the EL element may comprise additional organic layers, for example, of an oxydiazole or a tertiary amine, which serve to improve the charge transport or the charge injection.

An EL device of the type mentioned in the opening paragraph is disclosed in a publication by Burrows et. al., published in Appl. Phys. Lett. 65 (23), 1994, 2922. The known device consists of an organic electroluminescent element which is built up of a stack of an ITO layer, an EL layer of 8-hydroxyquinoline aluminium ($Alq_3$), a hole-transporting layer of N,N-diphenyl-N,N-bis(3-methylphenyl)1,1-biphenyl-4,4'diamine and an Mg:Ag layer, which is provided with a silver layer. Said EL element is surrounded by a housing consisting of a bottom plate and a top plate which are made of glass, said plates being interconnected by an epoxy-based adhesive for sealing. The ITO layer also forms the electrical leadthrough for the anode; the Mg:Ag/Ag layers also form the electrical leadthrough for the cathode. The leadthroughs are electrically insulated from each other by a layer of silicon nitride. The known device has disadvantages which render it unsuitable for use in durable consumer goods, such as a display or a backlight for a liquid crystal display or a watch. After several hours, a deterioration of the uniformity of the luminous surface occurs which can be observed with the unaided eye. The deterioration, which also takes place when the EL device is not in operation, manifests itself, for example, by so-called "dark spots" which are formed so as to be dispersed over the entire luminous surface. Also the presence of the housing itself gives rise to degradation of the EL device. For example, the epoxy-based adhesive gives off substances which are detrimental to the EL element. In addition, the manufacture of the EL device is time consuming. For example, the curing of a suitable epoxy-based adhesive takes 24 hours.

SUMMARY OF THE INVENTION

One of the objects of the invention is to overcome, or reduce, these disadvantages. The invention specifically aims at an EL device of which the uniformity of the luminous surface exhibits a deterioration in the course of time which can hardly, if at all, be observed with the unaided eye when the device is stored or operated under atmospheric conditions which may or may not be extreme. The invention particularly aims at precluding "dark spots" caused by the action of air and water. A further object is to provide an EL device which is compact and robust under normal production and operating conditions, and which exhibits a satisfactory resistance to mechanical and varying thermal loads. In addition, it should be possible to manufacture said EL device in a simple and cheap manner without the necessity of using, for example, expensive vacuum equipment for its manufacture. The housing should be such that neither its presence nor its manufacture give rise to degradation of the EL element. The performance of the EL element, for example measured in terms of luminance at a given voltage, should be comparable to corresponding elements which are stored or operated in an inert atmosphere.

These objects are achieved by an EL device of the type mentioned in the opening paragraph, which is characterized in accordance with the invention in that the housing includes a low-melting metal or a low-melting metal alloy, while forming an airtight and waterproof housing.

The use of a housing which is sealed by a low-melting metal or a low-melting metal alloy, which is provided from the melt or at a temperature near the melting point, enables an EL device to be obtained having a luminous surface whose uniformity exhibits no visible deterioration when the device is stored for at least 650 hours or operated for at least 400 hours under atmospheric conditions. In particular "dark spots" visible with the unaided eye are not observed, not even under extreme conditions. For example, exposure to alternating hot and cold baths of hot water and icewater for several days does not adversely affect the uniformity of the luminous surface of the EL device, which also proves that the EL device has good resistance to mechanical and varying thermal loads. The thickness of the EL device typically is several millimeters and of the same order of magnitude as EL devices which are not provided with the housing in accordance with the invention. Said housing can be manufactured in a few minutes, and sealing of said housing takes only approximately ten seconds. The manufacture of the housing does not require expensive vacuum equipment. It has been found that the performance of the device is comparable to that of EL elements which are operated and stored in nitrogen. In a typical example, in which a poly(phenylenevinylene) was used as the EL material, the luminance was 200 $Cd/m^2$ at 5.5 V and the EL efficiency was 1.2%.

Extensive experiments carried out by the inventors showed that the degree to which the housing should be airtight and waterproof must be such that organic materials cannot be employed as barrier materials in the housing. Even epoxy-based adhesives and high-molecular, halogenated or non-halogenated hydrocarbons, which are reputed to be the best barrier materials within the class of organic materials, are unsuitable. For example, apart from the worse barrier properties, the large difference between the coefficients of expansion of these materials and, for example, glass, and the resulting bonding problems proved to be disadvantageous. In addition, a conclusion which can be drawn from this is that the organic EL layer of the EL element must be screened completely by the housing.

The choice of the metal used to seal the housing is limited, in accordance with the invention, by the melting point. It is essential that the metal or metal alloy used for sealing has a low melting point to preclude damage to the EL element when the metal or metal alloy is processed from the melt. In this connection, a metal or metal alloy is considered to have a low melting point if processing from the melt does not lead to thermal degradation of the organic EL layer. The permissible melting point can be higher as the spacing between the metal and the organic EL layer of the element is greater, or as the time during which the element is exposed to the elevated temperature is shorter. If the intended application of the EL device does not require a compact housing, use can even be made of a low-melting glass having a melting point, for example, of 400° C. However, the melting point must not be so low that the metal melts under normal operating conditions of the EL device.

From the above, it can be concluded that a suitable metal or metal alloy preferably has a melting point in the range between 80° C. and 250° C. The metal is more widely applicable if the melting point ranges between 90° C. and 175° C., or better still, between 100° C. and 150° C., the optimum melting point being approximately 110° C.

A particular, preferred embodiment is characterized in accordance with the invention in that the metal alloy includes an element selected from the group formed by In, Sn, Bi, Pb, Hg, Ga and Cd. Many types of low-melting metal alloys are commercially available at a low price. The majority of the commercially available alloys include an element of the above group. Apart from a broad spectrum of melting points, these metals also offer a broad spectrum of other properties which are important for the housing, such as sensitivity to oxidation, adhesion to materials to be combined, such as glasses and indium tin oxides, coefficient of thermal expansion, ductility, dimensional stability, degree of shrinkage upon solidification and wetting. In applications in which toxicity is an important factor, alloys containing Hg or Cd, such as Sn (50 wt. %) Pb (32 wt. %) Cd (18 wt. %) are not to be preferred. If a somewhat flexible EL device is necessary, it is advantageous to use a ductile low-melting metal, such as indium (melting point 157° C.) or Sn(35.7 wt. %)-Bi(35.7 wt. %)-Pb(28.6 wt. %), which has a melting point of 100° C. To minimize stresses caused by solidification, a metal which, upon solidification, does not form crystalline domains and exhibits little shrinkage, such as Bi(58 wt. %)-Sn(42 wt. %), melting point 138° C., is to be preferred.

Sealing of the housing by means of a low-melting metal or a low-melting alloy proves to be surprisingly simple. Methods which are known per se and which are suitable for mass manufacture and for large surfaces, prove to be suitable. Suitable methods are, inter alia, thermocompression, soldering, spray coating, or if local heating is desirable, melting by means of, for example, a laser. Particularly suitable methods are foil melting, dip coating or drop casting. These methods have in common that the metal is processed from the melt. As a result, these techniques do not require expensive vacuum equipment and, in addition, enable relatively thick layers, typically, of hundred micrometers to be formed in a short period of time, typically, approximately ten seconds. To obtain an airtight and waterproof seal, it is important that the metal can be provided from the melt in a sufficiently large thickness. A suitable layer has a thickness in excess of one micrometer, for example approximately ten micrometers, or better still, several hundred micrometers. As regards other properties, such as flexibility, it is advantageous to use a smaller layer thickness of 1 to 10 micrometers.

A particular embodiment in accordance with the invention is characterized in that the low-melting metal or the low-melting alloy is provided with a bonding layer. The resistance to mechanical and varying thermal loads can be improved further if the device is provided with a bonding layer before the metal is applied. A further advantage of the use of a bonding layer is that the metal can be provided in accordance with a pattern while using differences in wettability. In this manner, a patterned, low-melting metal layer can be formed by means of dip coating. In addition, the bonding layer serves as a barrier to any diffusion of atoms from the low-melting metal towards the EL element.

The bonding layer can be provided, for example, by electroless deposition of silver and/or a nickel phosphor. A particularly suitable bonding layer is obtained by screen printing of a solderable, silver-containing glass paste. In this manner, the bonding layer, having a thickness of typically several tens of micrometers, can be provided in accordance with a pattern and in a short period of time without the use of vacuum equipment. If necessary, suitable bonding layers, containing, for example, Ag, Ni, Cr, Cu or Pt, can alternatively be provided by vapor deposition or sputtering, whether or not by simultaneously or successively using different sources. A stack of bonding layers can also be obtained in said manner. Particularly Cr/Ni, Cr/Ni/Ag, Pt/Ag and Pt/Cu stacks can suitably be used as a bonding layer between the EL element and the low-melting metal. Vapor-deposited or sputtered layers on the basis of Ni, Ni/Cu, Ni/Ag, Cr/Ni, Cr/Ni/Ag and Pt/Ag can suitably be used as the bonding layer between glass and the low-melting metal. V or Ti can be used instead of Cr. Bonding layers thus provided typically have a layer thickness of 100 to 500 nm.

A further preferred embodiment of the invention is characterized in that the housing comprises an electrical leadthrough which is at least partly enclosed in a low-melting glass. To apply a voltage across the electrodes of the EL element, the housing must be provided with at least two electrical leadthroughs. To preclude a short-circuit, the leadthroughs must be electrically insulated from other parts of the housing and, in particular, from each other. For this purpose, use can be made of airtight and waterproof insulators such as silicon nitride and silicon oxide, which are known per se.

Preferably, however, a low-melting glass is used as the insulator. The expression "low-melting glass" is to be understood to mean herein a glass having a melting point which is so low that, if said glass is processed from the melt, it does not adversely affect the operation of the EL device. This means that, given the thermal resistance of the organic EL layer, the low-melting glass can only be provided when the organic EL layer does not yet form part of the EL device in process of formation. It has been found that low-melting glasses provided on an ITO layer do not adversely affect the properties of the ITO layer.

Many variants of low-melting glasses having minimum melting points of approximately 350° C. are commercially available. Suitable glasses are, for example, lead-borate glasses filled with ceramic materials. The low-melting glass layer can be provided, whether or not in accordance with a pattern, by means of methods which are known per se, such as screen printing. In these methods, glass powder is formulated so as to form a paste which is provided on the substrate, whereafter said paste is sintered in a furnace, thereby forming the electrically insulated, airtight and waterproof glass.

Various variants of the housing are possible. In a first variant, the EL element is surrounded by two shaped parts, for example two glass plates, which are interconnected by means of a closed ring of a low-melting metal or metal alloy. The specific shape of the parts determines how many of such rings are necessary to seal the housing. For example, to seal a disc-shaped dial plate of a watch, which is provided with a duct for interconnecting the dials and the drive mechanism, two such rings are necessary.

A second variant uses one shaped part on which the EL element is positioned and which serves as the substrate. The housing is sealed by providing the entire EL element, as well as the regions of the shaped part adjoining the EL element, with a coating of a low-melting metal or alloy. Unlike the first variant, the presence of a cavity between the metal and the EL element will be avoided by providing the metal in liquid form. As, in the last-mentioned variant, the molten metal directly contacts the EL element, it is essential to use a low-melting metal.

The shaped parts can be manufactured from airtight and waterproof materials which are known per se. Suitable materials are, for example, high-melting metals, metal alloys or glass. As regards the light emission, it is advantageous to manufacture one of the shaped parts from a material which is transparent to the light to be emitted. Moreover, to save space, it is advantageous to use this shaped part as the substrate for the EL element.

Electrical leadthroughs can be realized in many ways. For example, an electrically conducting, transparent shaped part, such as a glass plate provided with a layer of ITO, can be used as an electrical leadthrough, while an electrically insulating, transparent shaped part is suitable to realize patterned or independently addressable lead-throughs and electrodes. A housing which is simple in terms of construction can be obtained by using the low-melting metal or metal alloy as the electrical leadthrough. An electrical leadthrough can also be provided in an insulating shaped part in a simple manner.

A particular embodiment in accordance with the invention is characterized in that the organic layer comprises an electroluminescent polymer. Electroluminescent polymers are suitable EL materials. They have good luminescent properties, a good conductivity and good film-forming properties. If use is made of simple techniques, such as spin coating, EL layers having a large surface area can be manufactured by means of these materials. Suitable polymers generally have a conjugated "backbone", such as soluble polyphenylenephenylenevinylenes, soluble polythiophenes and soluble poly-phenylenes. Polyphenylenevinylenes are very suitable EL materials. By means of substitution, in particular, in the 2- and 5-positions of the phenyl ring, the emission spectrum can be varied and readily soluble and processable variants can be obtained. In addition, said polymers are generally readily processable and yield amorphous layers. Polymers which are particularly suitable are 2,5 alkyl- and alkoxy-substituted polyphenylenevinylenes.

Examples of particularly suitable polyphenylenevinylenes are:

poly(2-methyl-5-(n-dodecyl)-p-phenylenevinylene)

poly(2-methyl-5-(3,7-dimethyloctyl)-p-phenylenevinylene)

poly(2-methyl-5-(4,6,6-trimethylheptyl)-p-phenylenevinylene)poly(2-methoxy-5-decyloxy-p-phenylenevinylene)

poly(2-methoxy-5-(2-ethylhexyloxy)-p-phenylenevinylene) (MEH-PPV).

The combination of the housing in accordance with the invention and an EL element whose organic EL layer comprises a 2,5-substituted poly(phenylenevinylene) is particularly advantageous, as experiments carried out by the inventors have shown that many poly(phenylenevinylene) variants already show degradation if they are exposed to temperatures of 80 to 100° C. for a long period of time.

These and other aspects of the invention will be apparent from and elucidated with reference to the embodiments described hereinafter.

DESCRIPTION OF THE PREFERRED EMBODIMENTS

Exemplary Embodiment 1

Figure 1:
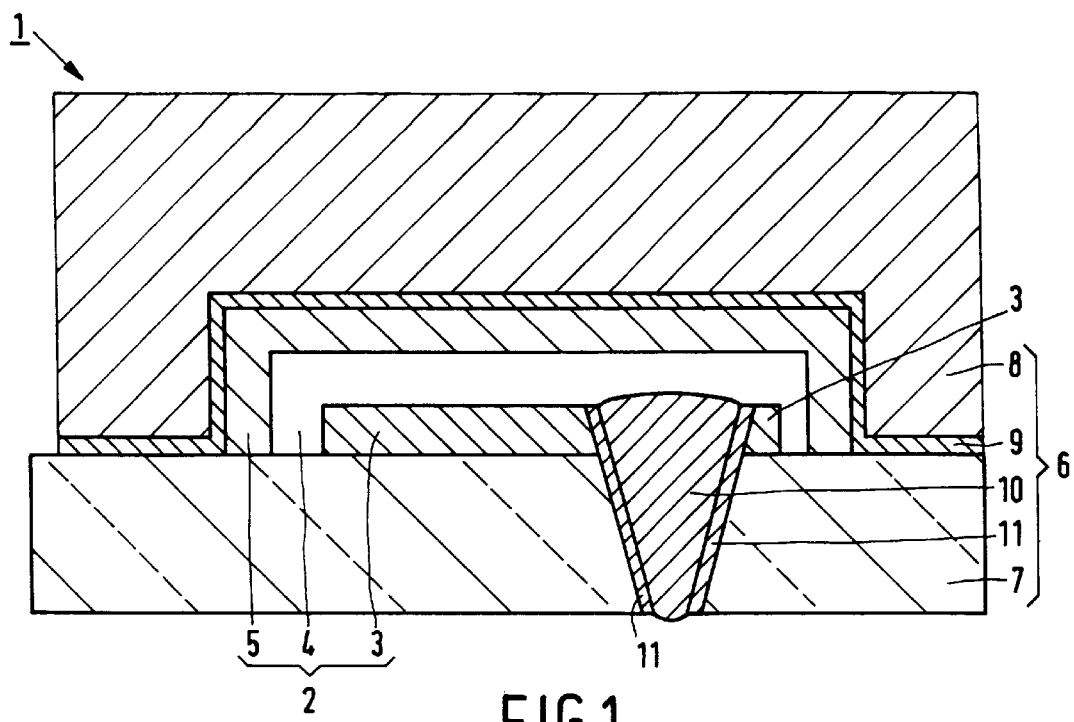
FIG. 1 is a schematic, cross-sectional view of an embodiment of the EL device in accordance with the invention.

FIG. 1 shows, in cross-section and not to scale, an EL device 1 in accordance with the invention. Said EL device comprises an EL element 2 which is composed of a positive, transparent electrode 3 which is entirely covered by an electroluminescent organic layer 4 which carries a negative electrode 5. Said EL element is enclosed in an airtight and waterproof housing 6. Said housing comprises a shaped part 7 of a transparent, electrically insulating material, which serves as the substrate for the EL element. The housing is sealed by a coating layer 8 of a low-melting metal alloy, which covers the entire EL element as well as regions of the shaped part 7 which adjoin the EL element. The coating layer 8 serves as an electrical connection for the negative electrode 5. Said coating layer 8 is provided with an electrically conducting bonding layer 9. The shaped part 7 is provided with an electrical leadthrough 10, which is connected to the positive electrode 3. The leadthrough 10 is surrounded by a bonding layer 11.

The EL device 1 can be manufactured as follows. In a nitrogen atmosphere, an aperture is formed in a glass plate, having dimensions of 2 cm by 1.5 cm and a thickness of 1 mm, which is provided with an 150 nm thick positive electrode 3 of indium tin oxide (supplier Balzers) by locally sandblasting a location where there is ITO. The walls of the aperture are coated with a silver-containing glass paste by means of a cotton bud, said paste being prepared by mixing 75 parts by weight of a mixture consisting of 8 wt. % lead-borate glass powder and 92 wt. % silver powder with 25 parts by weight of a mixture consisting of 50 wt. % alpha-terpineol and 50 wt. % ethylcellulose by means of a three-way roller. The glass paste is cured in a furnace at 450° C. for 30 minutes, thereby forming the bonding layer 11. The thickness of said bonding layer is approximately 30 micrometers. Subsequently, the aperture is filled with molten eutectic PbSn solder, which solidifies after cooling, thereby forming the electrical lead-through 10. Subsequently, the surfaces are cleaned by means of, respectively, soap, water and isopropanol. An approximately 150 nm thick organic EL layer 4 is provided by spin coating from an 0.6 wt. % solution of poly[2-methoxy-5-(2,7-dimethyloctyloxy)-1,4-phenylenevinylene], synthesized in accordance with the method described in Braun et. al., Synth. Met., 66 (1994), 75, in toluene. The EL material is removed along the edges by means of a cotton bud and/or a knife. Yb is vacuum deposited, via a mask, thereby forming a 200 nm thick negative electrode 5. An approximately 200 nm thick layer of nickel and a 200 nm thick layer of silver are successively provided by means of magnetron sputtering and vapor deposition, respectively, thereby forming the bonding layer 9. A 200 micrometer thick foil of Sn(50 wt. %)Pb(32 wt. %)Cd(18 wt. %) (supplier Witmetaal b.v.) having a melting point of 145° C. is applied to the bonding layer, the oxide skin of said foil being removed by scouring. The whole is placed on a hot plate of 155° C., so that the alloy melts and, after cooling, the coating layer 8 is obtained.

An EL device thus formed is immersed, in ambient conditions, in a water bath of 80° C. for approximately 10 seconds and, immediately afterwards, it is immersed in an ice bath for approximately 10 seconds. This procedure is repeated for 48 hours. After drying, a voltage of 6 V is applied to the electrodes 3 and 5, via leadthrough 10 and coating 8, so that the device emits orange light. The luminous surface does not exhibit "dark spots". The uniformity of the luminous surface is visibly equal to that of a control EL device without a housing, which is manufactured, and directly measured, in a nitrogen atmosphere.

Another EL device which is manufactured in this manner is subjected to a life test. In this test, the device is continuously operated for 400 hours under atmospheric conditions at a constant current density of 15 mA/cm$^2$. The voltage necessary to attain a current density of 15 mA/cm$^2$ remains constant for 400 hours, which means that the resistance of the EL element does not change in time. The luminance, which is determined by means of a photodiode and a Keithley 617 electrometer initially amounts to 200 Cd/m$^2$ and decreases to 60 Cd/m$^2$ after 400 hours. The uniformity of the luminous surface, however, remains constant. The luminance decreases uniformly over the entire luminous surface. Even after 400 hours, not a single "dark spot" is observed. The EL efficiency of the EL device, which is determined in a calibrated "integrating sphere", initially amounts to 1.2% and decreases at the same rate as the luminance.

For comparison, a few similar EL devices are manufactured, in which the coating 8 and the bonding layer 9 are replaced by a layer of an epoxy adhesive. Dependent upon the type of epoxy and the manner of processing, the service life of the EL device is only several hours and "dark spots" are observed after a short time already.

Another EL device thus manufactured is subjected to a "shelf life" test. In this test, the EL device is stored under ambient conditions and the luminance and the current are measured at regular intervals at a voltage of 6 V. During at least 650 hours, the current remains substantially constant and amounts to 0.028 A, whereas the luminance decreases from 130 to 115 Cd/m$^2$. Also in this case, the uniformity of the luminous surface is unchanged. The decrease in luminance takes place uniformly over the entire surface area. Also after 650 hours, the surface is still free of "dark spots".

Comparable results are achieved with EL devices in which the coating 8 consists of the low-shrinkage Bi(58 wt. %)Sn(42 wt. %) (supplier Arconium) or the ductile Sn(35.7 wt. %)Bi(35.7 wt. %)Pb(28.6 wt. %) (supplier Arconium) or indium.

Comparable results were achieved if the coating 8 was provided by dip coating in the following manner. After the provision of the bonding layer 9, the device is pre-heated on a hot plate of 155° C. and immersed for 10 seconds in a bath which is heated to 155° C. and which is filled with molten Sn(50 wt. %)Pb(32 wt. %)Cd(18 wt. %) (supplier Witmetaal B.V.). After removal from the bath and cooling, the housing is sealed by a 150 micrometer thick coating of said alloy.

Comparable results are also achieved if the organic layer comprises poly(2-methoxy-5-(2-ethylhexyloxy)-p-phenylenevinylene) (MEH-PPV) and if calcium is used for the negative electrode.

Exemplary Embodiment 2

Figure 2:
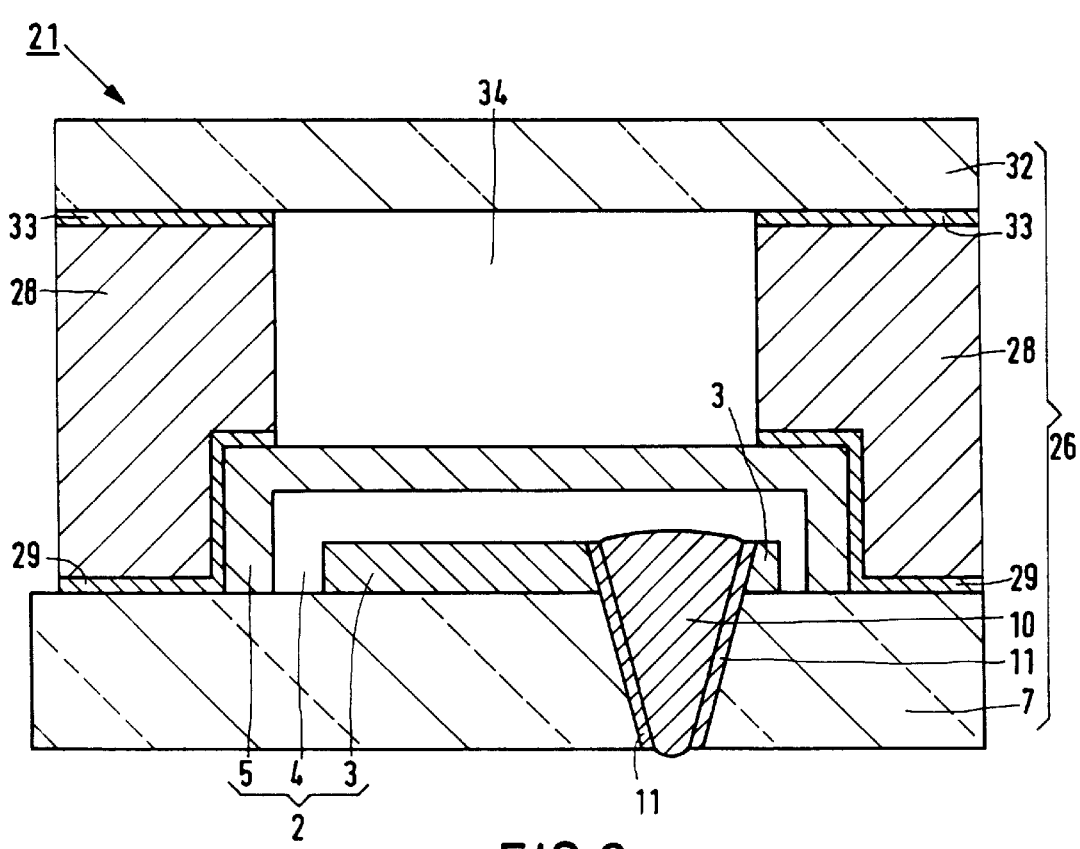
FIG. 2 is a schematic, cross-sectional view of a second embodiment of the EL device in accordance with the invention.

FIG. 2 shows, in cross-section and not to scale, an EL device 21 in accordance with the invention. Said device is very similar to the EL device 1. However, in this case, the housing 26 comprises a shaped part 32 instead of the coating 8, which shaped part is connected by means of a closed ring of a low-melting metal alloy 28 to the shaped part 7 so as to enclose a hollow space 34. Between the ring 28 and the shaped part 7 there is the ring-shaped, electrically conducting bonding layer 29, and between the ring 28 and the shaped part 32 there is an additional bonding layer 33. Said ring 28 electrically contacts the electrode 5, electrically feeding this electrode.

The EL device 21 can be manufactured as follows. The method described in exemplary embodiment 1 is repeated up to and including the provision of the bonding layer 29, with this difference that the provision of the bonding layer 29 takes place via a mask, which covers the edges of the device so as to provide also a part of the electrode 5 with a bonding layer. Subsequently, the device is provided on all sides with a ring-shaped layer of Sn(50 wt. %)Pb(32 wt. %)Cd(18 wt. %) by means of dip coating in the manner described hereinabove, which layer will form a part of the closed ring 28. Due to differences in wettability between the bonding layer and the other parts of the surface, metal is deposited only on the bonding layer. Subsequently, a 1 mm thick glass plate 32 is provided with a correspondingly patterned bonding layer 33. Said bonding layer 33 is provided with a ring-shaped layer of Sn(50 wt. %)Pb(32 wt. %)Cd(18 wt. %) by means of dip coating, which layer will form a second part of the closed ring 28. Both parts are subsequently placed on a hot plate of 155° C., thereby causing the ring-shaped layers to melt. Next, the parts are provided on top of each other in such a manner that the ring-shaped layers fuse together so as to form one closed ring 28. Subsequently, the metal is allowed to solidify. As the entire process is carried out in nitrogen, the space 34 is filled with nitrogen.

Exemplary Embodiment 3

Figure 3:
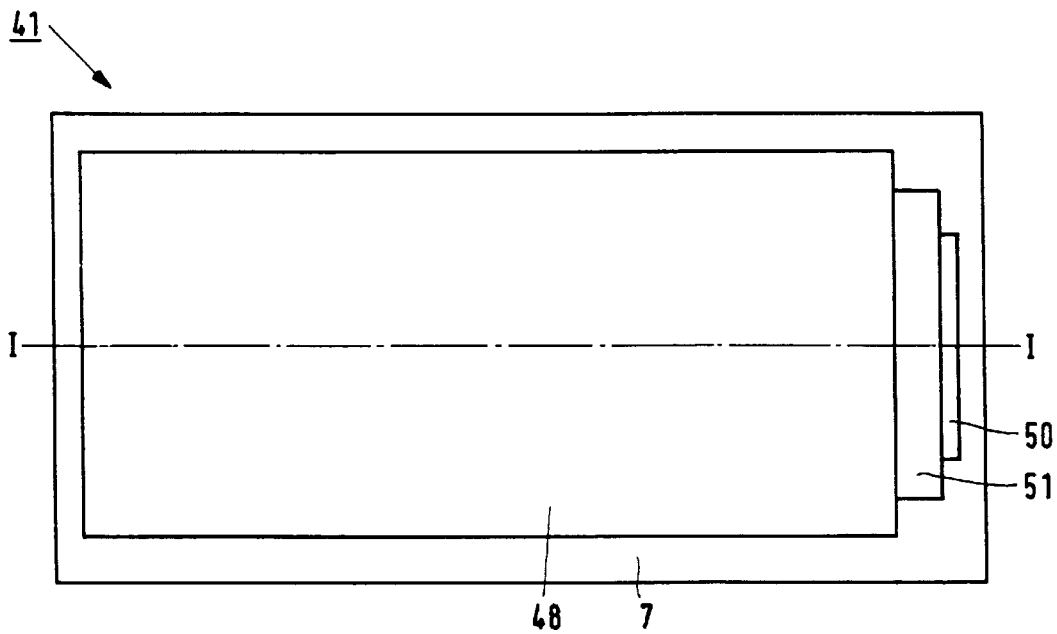
FIG. 3 is a schematic, plan view of a third embodiment of the EL device in accordance with the invention.
Figure 4:
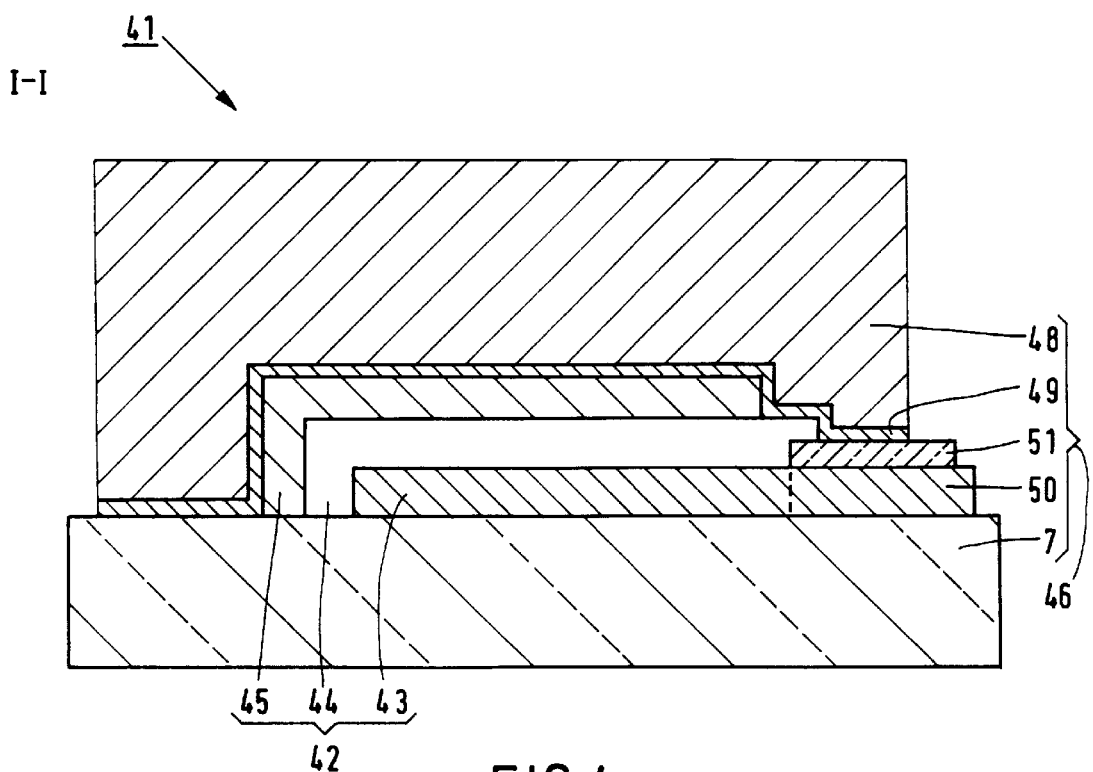
FIG. 4 is a schematic, cross-sectional view taken on the line I—I of the third embodiment of the EL device in accordance with the invention.

FIG. 3 is a plan view, not to scale, and FIG. 4 is a sectional view taken on the line I—I, not to scale, of an EL device 41 in accordance with the invention. Said EL device 41 is equal to device 1, with this difference that in the housing 46, the electrical leadthrough 10 is replaced by the electrical leadthrough 50 which electrically feeds the positive electrode 43 of the EL element 42, which element also comprises the organic EL layer 44 and the negative electrode 45. The electrical leadthrough 50 and the electrode 43 are formed from the same layer. The coating 48 of a low-melting metal is provided with a bonding layer 49 and separated from the electrical leadthrough 50 by the electrically insulating layer 51.

The EL device 41 can be manufactured as follows. A glass plate 7 which is covered with a 150 nm thick layer of ITO (supplier Balzers) (43,50) is cleaned, in succession, with soap, water and isopropanol. A lead-borate glass paste filled with ceramic materials (type LS0206, supplier Nippon Electric Glass Co. Ltd.) is screen printed onto the electrical leadthrough 50. After drying at 120° C. in air for 15 minutes, the temperature is slowly increased to 450° C., and a sintering process is carried out for 10 minutes thereby forming the airtight and waterproof electrical insulating layer 51. The EL device is completed by successively providing the EL layer 44, the negative electrode 45, the bonding layer 49 and the coating 48, as described in exemplary embodiment 1.

Exemplary Embodiment 4

Figure 5:
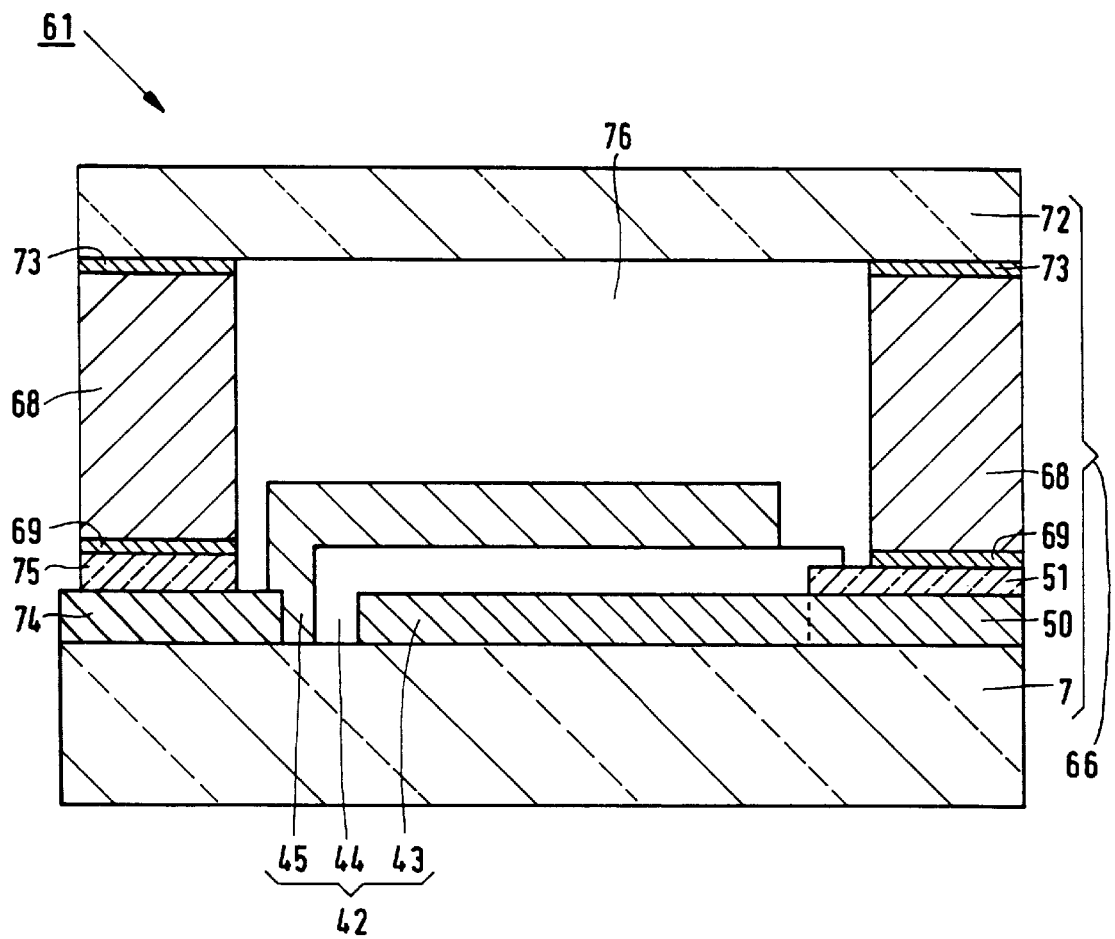
FIG. 5 is a schematic, cross-sectional view of a fourth embodiment of the EL device in accordance with the invention.

FIG. 5 shows in cross-section and not to scale, an EL device 61 in accordance with the invention. Said device 61 is very similar to the EL device 41, with this difference that in the housing 66, the bonding layer 49 is replaced by the ring-shaped bonding layer 69 and the coating 48 is replaced by the ring of a low-melting metal 68, the shaped part 72 and the ring-shaped bonding layer 73, thereby enclosing the hollow space 76. The device further comprises an electrical leadthrough 74, which is electrically insulated from the closed ring 68 by the layer of a low-melting glass 75.

What is claimed is:

1. An electroluminescent device comprising an electroluminescent element, the electroluminescent element comprising an electroluminescent organic layer and two electrodes in contact with the electroluminescent organic layer, said electroluminescent element being enclosed in a housing, characterized in that the housing consists of inorganic barrier materials, said materials comprising a low-melting metal or a low-melting metal alloy having a melting point below about 250° C., and said housing forms an airtight and waterproof seal for said electroluminescent element.

2. An electroluminescent device as claimed in claim 1, characterized in that the metal alloy comprises an element selected from the group formed by In, Sn, Bi, Pb, Hg, Ga and Cd.

3. An electroluminescent device as claimed in claim 3, characterized in that the metal used is indium or the metal alloy is selected from the group formed by Sn(50 wt. %)Pb(32 wt. %)Cd(18 wt. %), Bi(58 wt. %)Sn(42 wt. %), Sn(35.7 wt. %)Bi(35.7 wt. %):Pb(28.6 wt. %).

4. An electroluminescent device as claimed in claim 1, characterized in that the low-melting metal or the low-melting alloy is provided with a bonding layer.

5. An electroluminescent device as claimed in claim 1, characterized in that the housing comprises an electrical leadthrough which is at least partly enclosed in a low-melting glass.

6. An electroluminescent device as claimed in claim 1, characterized in that the organic layer comprises an electroluminescent polymer.

7. An electroluminescent device as claimed in claim 6, characterized in that the organic layer comprises a poly(phenylenevinylene).

* * * * *